(12) United States Patent
Morrar

(10) Patent No.: US 6,418,304 B1
(45) Date of Patent: Jul. 9, 2002

(54) METHOD AND APPARATUS FOR IMPROVING EFFICIENCY OF HIGH-POWER LINEAR AMPLIFIER

(75) Inventor: Sam Morrar, Randolph, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/154,225

(22) Filed: Sep. 16, 1998

(51) Int. Cl.[7] .............................. H04B 1/28; H04B 1/38; H01Q 11/12

(52) U.S. Cl. ..................... 455/343; 455/127; 455/561

(58) Field of Search .......................... 455/561, 78, 83, 455/127, 343, 38.3, 574, 82; 330/251, 286, 256

(56) References Cited

U.S. PATENT DOCUMENTS

| | | | |
|---|---|---|---|
| 4,439,744 A | | 3/1984 | Kumar et al. |
| 4,748,423 A | | 5/1988 | Jinich |
| 5,278,517 A | | 1/1994 | Fujita |
| 5,426,641 A | | 6/1995 | Afrashteh et al. |
| 5,568,094 A | | 10/1996 | Bowen et al. |
| 5,669,068 A | * | 9/1997 | Kielmeyer et al. ............ 455/83 |
| 5,712,593 A | * | 1/1998 | Buer et al. .................. 330/129 |
| 5,724,005 A | * | 3/1998 | Chen et al. .................. 330/279 |
| 5,793,757 A | * | 8/1998 | Uddenfeldt ................. 370/335 |
| 5,831,477 A | * | 11/1998 | Tsumura ....................... 330/51 |
| 6,043,712 A | * | 3/2000 | Leizerovich et al. ........ 330/279 |
| 6,122,488 A | * | 9/2000 | Leizerovich et al. .......... 455/78 |
| 6,215,358 B1 | * | 4/2001 | Hon et al. ................... 330/289 |
| 6,215,987 B1 | * | 4/2001 | Fujita ......................... 455/127 |
| 6,223,056 B1 | * | 4/2001 | Appel ......................... 455/561 |
| 6,298,221 B1 | * | 10/2001 | Nguyen ........................ 455/73 |

FOREIGN PATENT DOCUMENTS

| | | |
|---|---|---|
| EP | 0 837 559 | 4/1998 |
| WO | WO 97/41642 | 11/1997 |

OTHER PUBLICATIONS

Esmailzadeh et al. Time Division Duplex CDMA Communications, IEEE Personal Communications, 1997.*
European Search Report—Dated Dec. 17, 1999.
New RF ICs and Modules Boost Market Development, RF Design. Apr. 17, 1994, No. 4, Atlanta, GA.
Miniaturized, X–Band Solid–State Transmitter, Published Jun. 14, 1993, 1993 IEEE MTT–S Digest.

* cited by examiner

*Primary Examiner*—Vivian Chin
*Assistant Examiner*—Charles N. Appiah
(74) *Attorney, Agent, or Firm*—Dilworth & Barrese

(57) ABSTRACT

Disclosed is a method and apparatus for improving thermal efficiency and reliability of a linear power amplifier of a communication system. In an illustrative embodiment, the communication system operates in a half-duplex mode and a transistor control terminal (e.g., gate) of the amplifier is biased at a first bias voltage during transmit intervals of the half-duplex mode. The control terminal is biased at a second bias voltage different from the first bias voltage during receive intervals. The second bias voltage is sufficient to reduce idle currents in the amplifier during the receive intervals, thereby improving thermal efficiency of the amplifier. Also disclosed is a base station including a base station controller, a variable bias control circuit and a linear power amplifier. The variable bias control circuit operates under the control of the base station controller to supply a variable bias voltage to the amplifier. Thermal efficiency of the amplifier is improved by reducing idle currents via appropriate bias voltage control during a weak signal transmitting mode and/or during receive intervals of a half-duplex operating mode.

21 Claims, 7 Drawing Sheets

METHOD AND APPARATUS FOR IMPROVING EFFICIENCY OF HIGH-POWER LINEAR AMPLIFIER

BACKGROUND OF THE INVENTION

The present invention relates generally to wireless communications. More particularly, the invention relates to a method and apparatus for improving efficiency of a high power linear amplifier employed in a base station of a wireless communications system.

Base stations of contemporary wireless communications systems (e.g., cellular telephone systems) typically employ a number of high power linear amplifiers to amplify information signals destined for wireless communication terminals (e.g., cellular telephones, personal communication devices, etc.) For instance, in frequency division multiple access (FDMA) systems, each high power amplifier usually amplifies a multi-carrier signal, with each carrier modulated with voice and data information destined for a particular wireless terminal. The communication channel associated with each carrier is narrowband, typically about 25–30 KHz wide. Hence, the high power amplifier must be highly linear to avoid generating intermodulation distortion (IMD) products that will introduce noise into adjacent communication channels. Whether the modulation technique is analog, e.g., FM, or digital, such as in time division multiplexed (TDM) systems employing phase shift keying (PSK), amplifier linearity is important to system performance. Similarly, in code division multiple access (CDMA) systems, in which many information signals are coded and transmitted over a common, wider communication channel of about 1.2 MHz, linear amplification in the high power stage is required for optimum performance.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between pinch-off and saturation. Class B amplifiers are biased near pinch-off, resulting in a rectified drain current waveform. Class AB amplifiers are biased in between the bias points of classes A and B.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

SUMMARY OF THE DISCLOSURE

The present disclosure pertains to a method and apparatus for improving thermal efficiency and reliability of a linear power amplifier of a communication system. In an illustrative embodiment, the communication system operates in a half-duplex mode in which information signals are transmitted and received in alternating time intervals. A transistor control terminal (e.g., gate) of the amplifier is biased at a first bias voltage during transmit intervals of the half-duplex mode, and at a second bias voltage different from the first bias voltage during receive intervals of the half-duplex mode. The second bias voltage is sufficient to reduce idle currents in the amplifier during the receive intervals, thereby improving thermal efficiency of the amplifier.

Also disclosed is a base station including a base station controller, a variable bias control circuit and a linear power amplifier. The variable bias control circuit operates under the control of the base station controller to supply a variable bias voltage to the amplifier. Thermal efficiency of the amplifier is improved by reducing idle currents via appropriate bias voltage control during a weak signal transmitting mode and/or during receive intervals of a half-duplex operating mode.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF CERTAIN PREFERRED EMBODIMENTS

A preferred embodiment of the invention will now be described as having particular utility within a terrestrial base station of a wireless communication system. It is understood, however, that this application is merely exemplary and that the invention may have other useful applications such as within a satellite repeater or within a broadcasting system.

Figure 1:
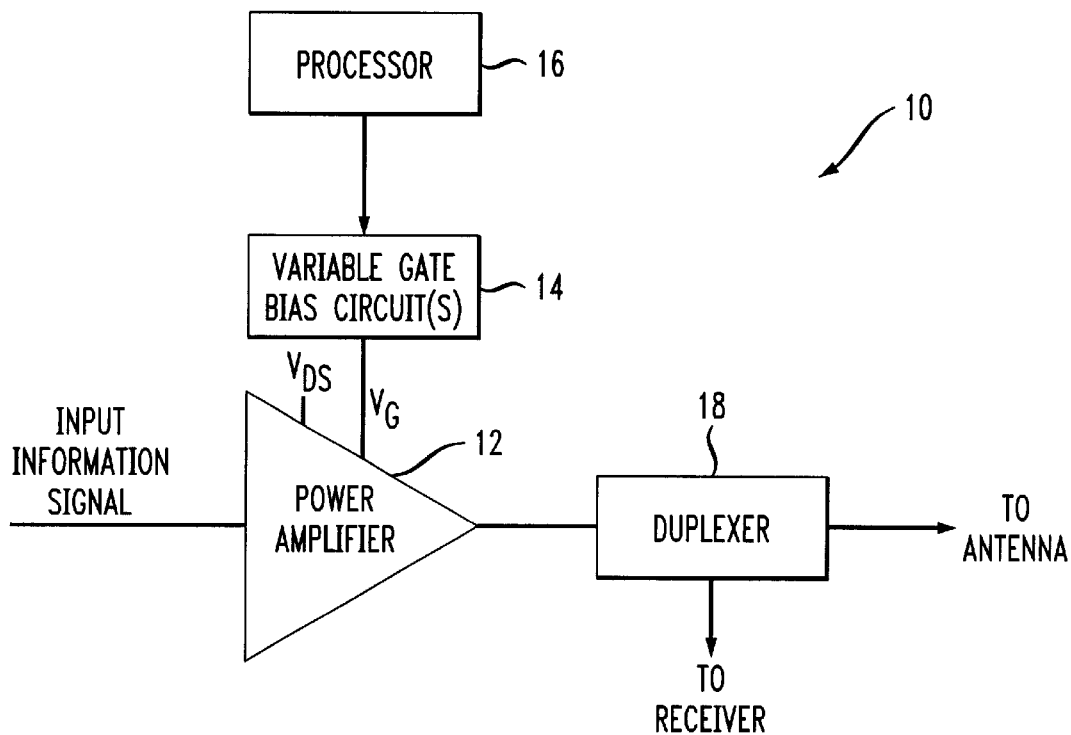
FIG. 1 is a block diagram of transmitter electronics in accordance with the invention.

Referring now to FIG. 1, an illustrative embodiment of a transmitter 10 in accordance with the present invention is schematically shown in a simplified block diagram. Transmitter 10 is comprised of a power amplifier 12, a variable gate bias circuit 14, a processor 16 which controls an output gate voltage $V_G$ of bias circuit 14, and a duplexer 18 coupled to the output of power amplifier 12. Power amplifier 12 is typically a radio or microwave frequency, multiple stage amplifier that amplifies a modulated input information signal to a power level in the range of several watts to 100 watts or more, depending on the application. The input information signal is typically a composite information signal such as a multi-carrier analog or digital-format FDMA signal, time division multiple access (TDMA) signal or CDMA signal. The composite information signal contains voice and/or data destined for a number of wireless terminals.

Bias circuit 14 supplies gate bias voltage $V_G$ to one or more transistors within power amplifier 12. Alternatively, bias circuit 14 generates and supplies multiple gate voltages, with each being supplied to one or more of the transistors within amplifier 12. In the latter case, gate bias circuit 14 may be comprised of a number of bias circuits operating independently. In either case, processor 16 supplies a control signal or signals to variable bias circuit(s) 14 to control the value of each gate bias voltage provided to amplifier 12.

Figure 2:
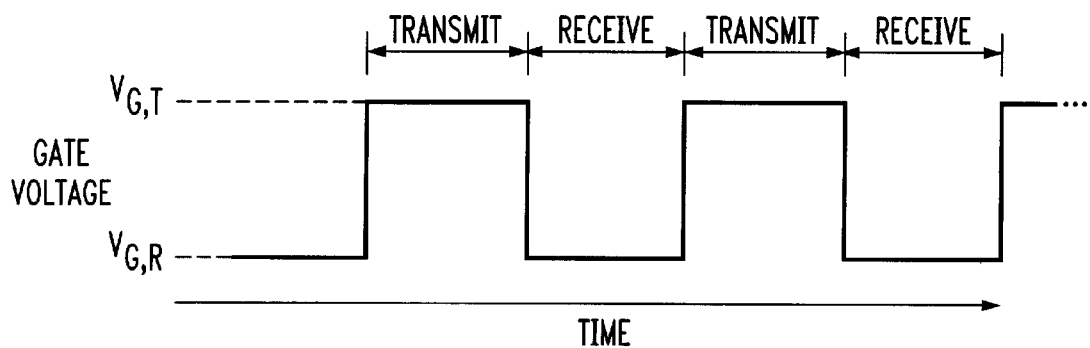
FIG. 2 is a timing diagram illustrating a first gate voltage variation method in accordance with the invention.

FIG. 2 is a gate voltage timing diagram illustrating a first method for improving amplifier efficiency in accordance with the invention. In this embodiment, transmitter 10 operates in a half-duplex mode in which RF power is transmitted and received during alternating "transmit" and "receive" intervals. During the transmit intervals, the input information signal to amplifier 12 contains RF energy; during the receive intervals, the input signal is substantially devoid of RF energy. Preferably, the same carrier frequency is used during transmit and receive of a common communication session to thereby improve spectrum efficiency. Each transmit and receive interval is typically on the order of about one millisecond for voice communication applications. During the transmit intervals, processor 16 commands bias supply circuit 14 to supply the gate voltage $V_G$ at the level $V_{G,T}$ which is a normal gate voltage to achieve substantially linear amplification. That is, $V_{G,T}$ is a gate voltage sufficient to operate power amplifier 12 in the class A or class AB mode. During the receive intervals, processor 16 commands bias circuit 14 to supply $V_G$ at the level $V_{G,R}$ which is sufficient to operate amplifier 12 in a more efficient class AB mode (or class B mode) in which less idle current is drawn. That is, during the receive intervals, amplifier 12 draws significantly less idle current than it otherwise would if the gate voltage remained at $V_{G,T}$ during that time. Conversely, if the gate voltage remained at $V_{G,T}$ during the receive intervals, the idle current drawn would be about the same as the average current drawn during the transmit intervals, resulting in substantial additional power dissipation and heat. Nevertheless, the latter approach is taken in prior art base stations. With embodiments of the present invention, the reduced power dissipation of the power amplifier improves the overall DC to AC efficiency and reduces the heat generated by the amplifier (improving thermal efficiency). Consequently, heat sinks can be simplified, thereby reducing amplifier size and weight; fan systems need not be as elaborate; the DC power consumed is reduced, and field reliability is improved.

Figure 3A:
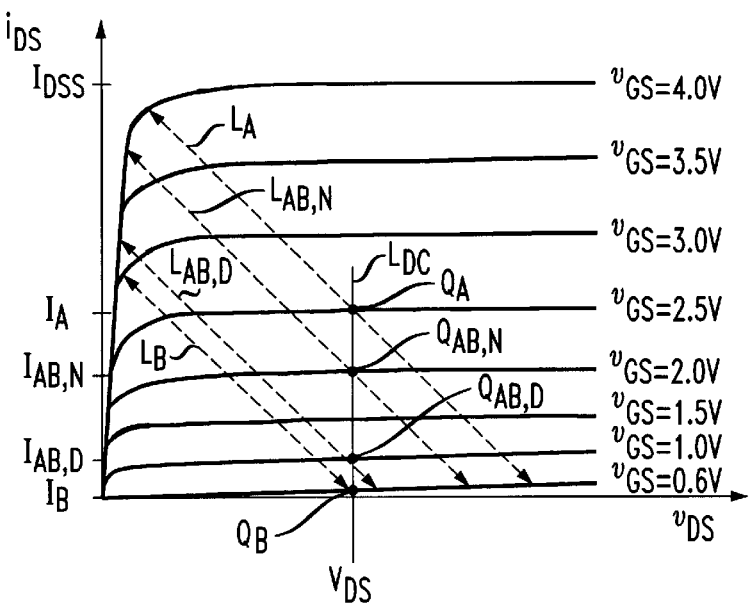
FIG. 3A depicts exemplary I-V curves and load lines for amplifiers that may be used within various embodiments of the invention.

FIGS. 3A–3E further illustrate the principles of the invention. FIG. 3A is an illustrative I-V diagram for a given transistor within amplifier 12. In practice, the I-V curves will depend on the transistor design and manufacturing process; such curves are typically supplied by the transistor manufacturer. The parameter $i_{DS}$ represents the current (DC plus AC current) flowing from drain to source of the device; $I_{DSS}$ represents the maximum (saturated) current flow from drain to source; $v_{DS}$ is the instantaneous voltage (DC plus AC) appearing across the drain to source terminals; $V_{DS}$ is the DC component of the drain to source voltage; $v_{GS}$ is the gate to source voltage (which is the same as the gate voltage if the source is grounded). The point $Q_A$ represents an approximate class A quiescent operating point. Load line $L_A$ is an exemplary AC load line for class A operation. Current $I_A$ is the average current drawn during class A operation, whether or not an AC signal is present. It is noted here that in FIG. 3A, the drain current is shown to increase for larger (more positive) values of $v_{GS}$. Such is the case for depletion mode devices; for enhancement mode devices, the drain current increases for more negative gate to source voltages.

Figure 3B:
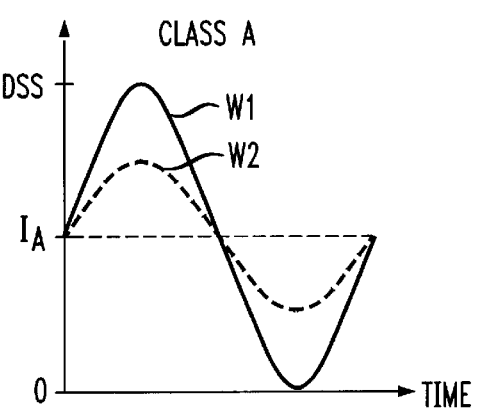
FIGS. 3B–3E illustrate various classes of amplifier operation.

FIG. 3B illustrates current $i_{DS}$ vs. time for class A operation for the case of a simple sine wave input signal (single tone). The current waveform W1 is the current waveform for a maximum output power condition for non-overdriven operation. The maximum efficiency for this case is 50%. Waveform W2 represents the $i_{DS}$ current for a lower level output signal, in which case the efficiency is less than 50%. When no input signal is present the current remains at the idle current $I_A$. For the textbook example of a single tone input, if the amplifier is allowed to be overdriven, the waveform clips equally on the top and bottom, enabling higher efficiency to be achieved, but typically degrading linearity. In the present embodiment, however, the input signal is usually a multi-tone signal or spread-spectrum signal as a CDMA signal which varies non-linearly with time. For these cases, signal statistics are usually considered in the transmitter design so that clipping is allowed to occur only a small percentage of the time without excessively degrading linearity on average. Thus, the average current is about the same as the DC quiescent (idle) current.

Figure 3C:
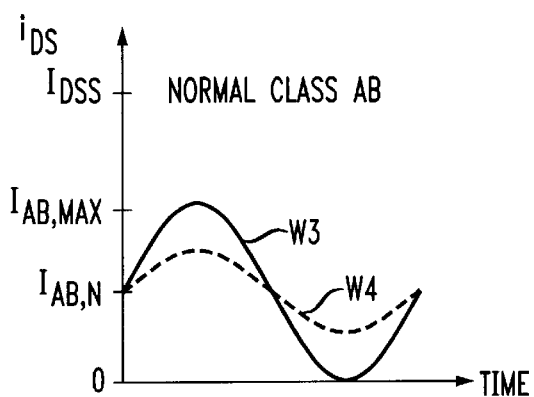

Returning to FIG. 3A, the point $Q_{AB,N}$ represents an exemplary quiescent operating point for "normal" or "slight" class AB operation, in which the applied gate voltage $v_{GS}$ is changed somewhat from the class A value, but not enough to significantly degrade linearity. The same drain-to-source DC bias voltage $V_{DS}$ as for the class A case is shown; however, in practice, a different $V_{DS}$ is often used in class AB operation for the same transistor. The exemplary normal class AB case reduces the idle current to $I_{AB,N}$. Load line $L_{AB,N}$ is the load line for this case and is parallel to the class A load line since the same output impedance is assumed. FIG. 3C illustrates the drain current variation for this case. Current waveform W3 represents the maximum, non-overdriven output power condition in which the current excursion is from zero to a maximum value $I_{AB,MAX}$ which is twice the idle current $I_{AB,N}$. Waveform W4 illustrates a current waveform for a lower input signal level (and lower output power level). The sine wave amplitude is reduced, but the average current $I_{AB,N}$ remains the same, resulting in reduced efficiency.

Figure 3D:
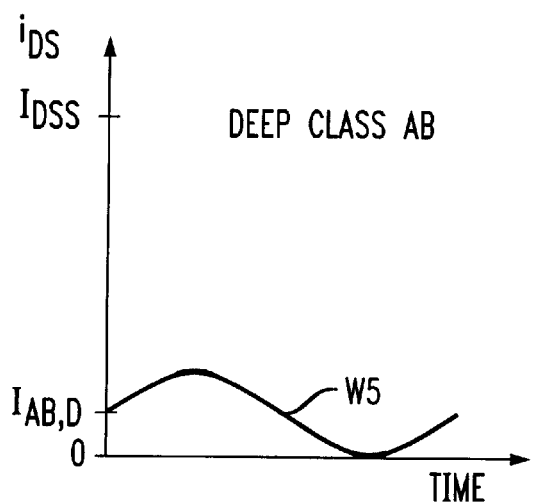
Figure 3E:
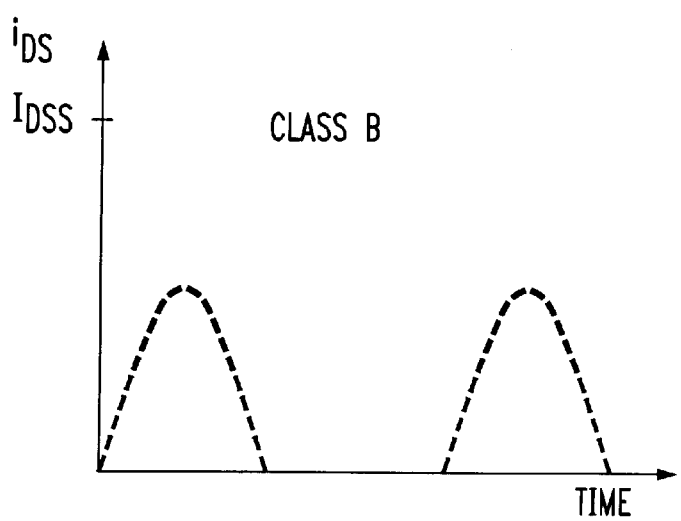

With continuing reference to FIG. 3A, the quiescent operating point $Q_{AB,D}$ corresponding to "deep" class AB operation is attained by applying an even lower gate voltage $V_{GS}$ while maintaining the same drain bias $V_{DS}$ in this example. (As used herein, the terms "deep" and "normal" class AB operation are relative terms; deep class AB operation implies operation closer to class B than the normal, highly linear class AB operation). The idle current is reduced to $I_{AB,D}$. The current variation is along load line $L_{AB,D}$, resulting in a current waveform as shown in FIG. 3D if a small input signal is present. (The small input signal case will be discussed later.) Class B operation can be attained by lowering the gate voltage further to set the quiescent operating point at $Q_B$ with the attendant load line $L_B$ and extremely low or negligible idle current $I_B$. FIG. 3E illustrates the class B current waveform if a large input signal is present. In the ideal case, clipping occurs on just the bottom half of the sine wave. Note that large signal class B operation is not contemplated in the high efficient modes disclosed herein; class B biasing is contemplated only if no signal is present during the class B biasing interval, i.e., during the receive intervals of the half-duplex mode.

Now, considering FIGS. 3A–3E in conjunction with FIG. 2, during the transmit intervals, operation is in class A or normal class AB so that $V_{G,T}$ is set to establish the quiescent point at $Q_A$ or $Q_{AB}$, which in the example shown, corresponds to $V_{GS}$ in the range of 2–2.5V. During the receive intervals, the gate voltage is lowered towards pinch-off. Thus, if transmit mode operation is class A, the gate voltage is lowered during the receive intervals so as to change the operating point to between $Q_{AB,N}$ and $Q_B$ or even $Q_C$ (for class C) corresponding to $V_{GS}$=0V. That is, the gate voltage is lowered from 2.5V ($V_{G,T}$=2.5V) to between 0 and 2.0V ($V_{G,R}$=0 –2.0V) in the example of FIG. 3A. In the embodiment according to FIG. 2, no input signal is present during the receive intervals so that the drain current during the receive intervals is just a constant current in the range of $I_{AB,N}$ to $I_B$, depending on the gate voltage $V_{G,R}$ selected. Similarly, if the transmit mode operation is normal class AB, the gate voltage is lowered during the receive intervals to, e.g., within the range corresponding to $Q_{AB,D}$ to $Q_B$. Hence, the idle current is substantially reduced from $I_{AB,N}$ to within the range of $I_B$ to $I_{AB,D}$.

For the embodiments disclosed herein, an advantage of setting the gate voltage $V_{G,R}$ during receive at a value corresponding to a class AB condition as opposed to a class B or class C condition is as follows: when the gate voltage is switched back to $V_{G,T}$, due to the internal transistor capacitances, the amount of time it takes for the amplifier to regain its linear amplification property is shorter when switching from the class AB bias condition than from the class B or C bias condition. On the other hand, idle currents are reduced to essentially zero for the class B or C bias conditions. Hence, there is a tradeoff between the idle current draw and the switching time to return to the linear amplification state. The tradeoff also applies to the degree of class AB operation during the receive interval: the deeper (i.e., closeness to class B) the class AB operation, the longer the switching time needed to return to linearity. Another factor to be considered is that the switching back to $V_{G,T}$ can be allowed to take place a predetermined time interval prior to the start of the next transmit interval. Thus, the additional switching time needed to return to linearity can be compensated for in this manner, but then additional current draw will take place during the extended switching interval. Accordingly, in consideration of these tradeoffs and of the individual transistor characteristics, the value selected for $V_{G,R}$ can be determined via calculation or empirical observations.

Figure 4:
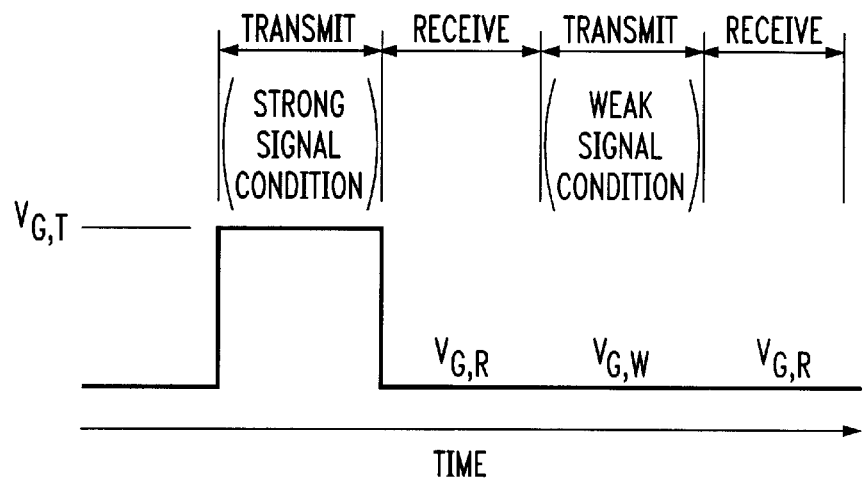
FIGS. 4–5 are timing diagrams illustrating alternative gate voltage variation methods of the present invention.

Turning now to FIG. 4, a second method of improving amplifier efficiency in accordance with the invention is illustrated. Transmitter 10 continues to operate in the half-duplex mode in this embodiment. However, a "weak signal" operating mode is permitted during the transmit intervals, in which the output power of power amplifier 12 is reduced. For instance, if processor 16 determines that if some or all of the wireless terminals designated to receive the transmitted signal from power amplifier 12 are within a predetermined close range to the base station, then the weak signal mode can be initiated. This determination is typically made by performing receive signal strength indicator (RSSI) measurements at the base station. The RSSI results are analyzed in conjunction with knowledge of the transmitter power level of the individual wireless terminals, to thereby determine their respective ranges from the base station. In the weak signal mode, processor 16 commands bias supply circuit 14 to supply the gate bias $V_G$ at a $V_{G,W}$ level corresponding to normal or deep class AB operation. In other words, if the normal transmit mode operation (strong signal mode) is class A, the weak signal transmit mode operation is normal class AB or deep class AB; if the strong signal transmit mode operation is normal class AB, the weak signal transmit mode operation is deep class AB. Consequently, the $i_{DS}$ current waveform during the weak signal mode transmit intervals will have a range similar to that of waveforms W4 or W5 of FIGS. 3C and 3D, respectively, depending on the gate voltage $V_{G,W}$ selected. During the receive intervals, the $i_{DS}$ current will be the constant $I_{AB,N}$ or $I_{AB,D}$ values, as the case may be. It is noted that in the diagram of FIG. 4, the weak signal condition gate voltage $V_{G,W}$ is set equal to $V_{G,R}$, which avoids additional switching. However, $V_{G,W}$ and $V_{G,R}$ need not be the same.

During operation in the weak signal condition transmit intervals, the reduced output power of amplifier 12 is due to either a lower gain at the quiescent operating point of $V_{G,W}$ and/or a lower input signal level. As the quiescent operating point is reduced towards the class B condition, small signal transistor gain is typically lower for most commercially available radio or microwave frequency transistors. If necessary, the input signal level to the amplifier can be controlled by adding a programmable attenuator on the input side of amplifier 12 and controlling its attenuation via suitable commands from processor 16.

Accordingly, with the approach illustrated in FIG. 4, amplifier efficiency is improved in two ways: by reducing idle current during the receive intervals, and by improving operating efficiency during the weak signal transmit intervals.

Figure 5:
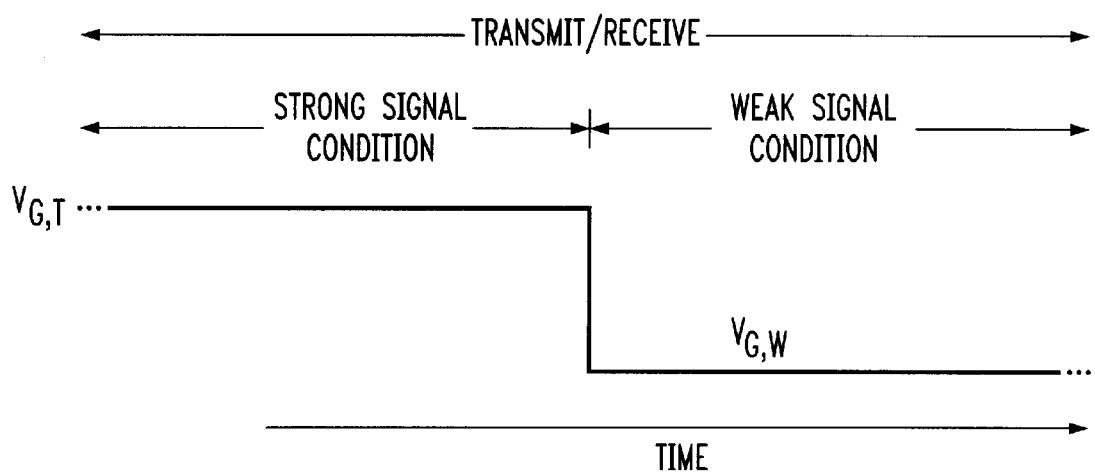

Referring to FIG. 5, another method of varying amplifier gate voltage to improve amplifier efficiency is illustrated. With this approach, transmitter 10 operates in a full-duplex mode wherein outbound signals are transmitted continuously by transmitter 10 rather than in alternating time intervals. Likewise, inbound signals are continually received by a receiver coupled to duplexer 18 instead of just during alternating receive intervals. Processor 16 determines when to provide normal transmit mode operation or weak signal transmitter operation as in the previous case of FIG. 4, e.g., by analyzing the results of RSSI measurements performed at the base station. The weak signal mode is implemented in the same manner as for the above case, i.e., with bias supply circuit 14 adjusting the gate voltage(s) to amplifier 12 to the $V_{G,W}$ level corresponding to either normal or deep class AB operation. Thus, amplifier efficiency is improved in the weak signal mode by producing the same amount of output power as would be produced without the change in gate voltage, but with less DC quiescent (idle) current and hence, less DC power dissipated.

For operation in the half-duplex mode, some improvement in thermal efficiency can be realized by adjusting the gate voltage in accordance with the weak and strong signal modes only. That is, if the gate voltage remains at $V_G$ during both the transmit and receive intervals of the strong signal mode and is then switched to $V_{G,W}$ during the weak signal mode, efficiency is improved, but not to the extent of the case of FIG. 3.

Figure 6:
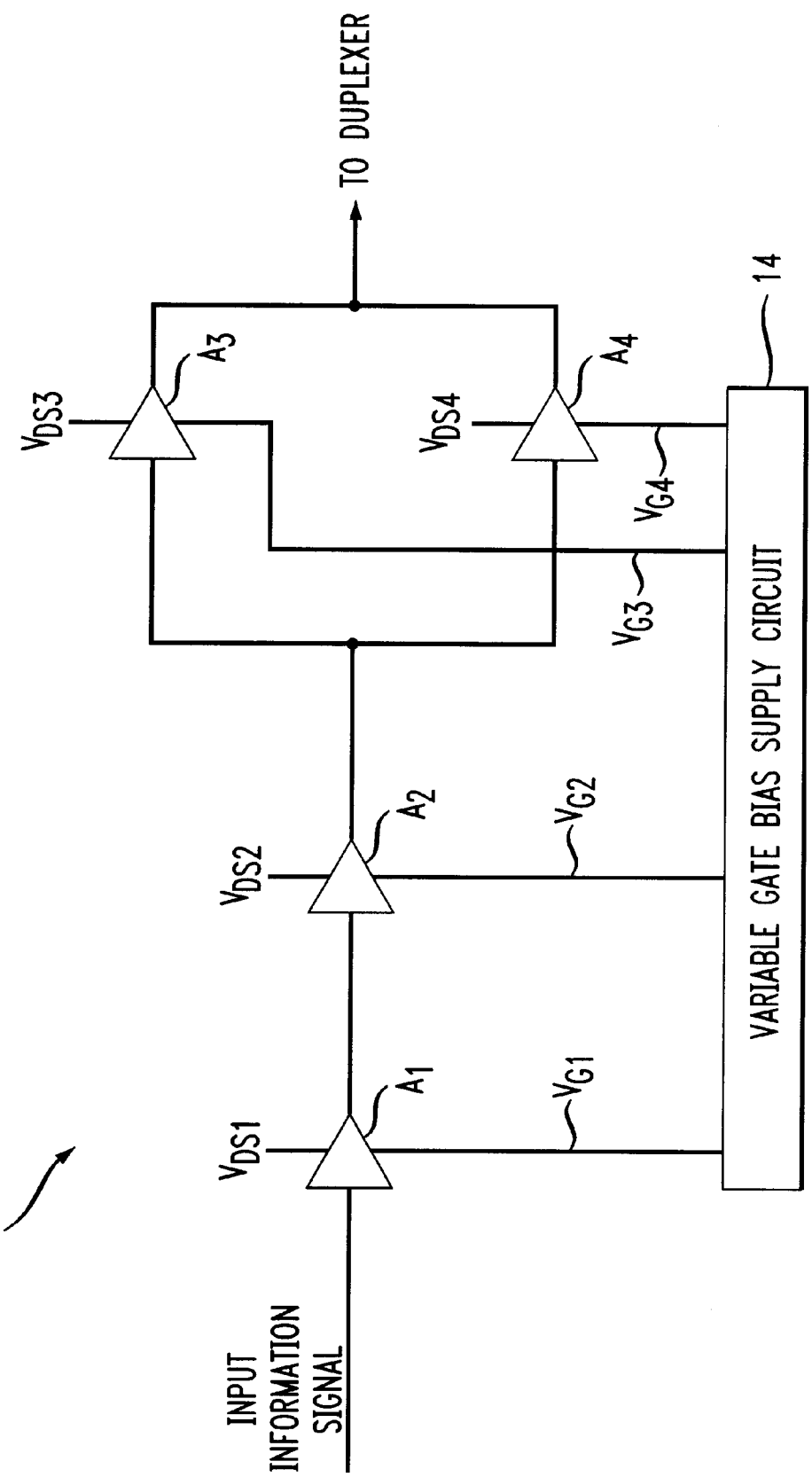
FIG. 6 is a circuit diagram of an illustrative embodiment of a power amplifier.

Referring now to FIG. 6, an illustrative multi-stage embodiment of power amplifier 12 is shown. Three stages in cascade are employed, with the output stage comprising amplifiers $A_3$ and $A_4$ in parallel. Each amplifier $A_1$–$A_4$ receives its respective gate bias voltage $V_{G1}$–$V_{G4}$ from bias supply circuit 14. Drain voltages $V_{DS1}$–$V_{DS4}$ supplied to the respective devices are preferably equal in magnitude to reduce the number of power supplies. The amplifiers may operate during the normal transmit operation in different classes; for instance, the output stage devices $A_3$ and $A_4$ may operate in class AB while the input stage devices $A_1$ and $A_2$ operate in class A. To improve amplifier efficiency using one of the above-described methods, the gate voltage to preferably all three stages is suitably changed during the appropriate time intervals. However, some benefit can also be provided by suitably changing the gate voltage to only one or two of the stages.

Figure 7:
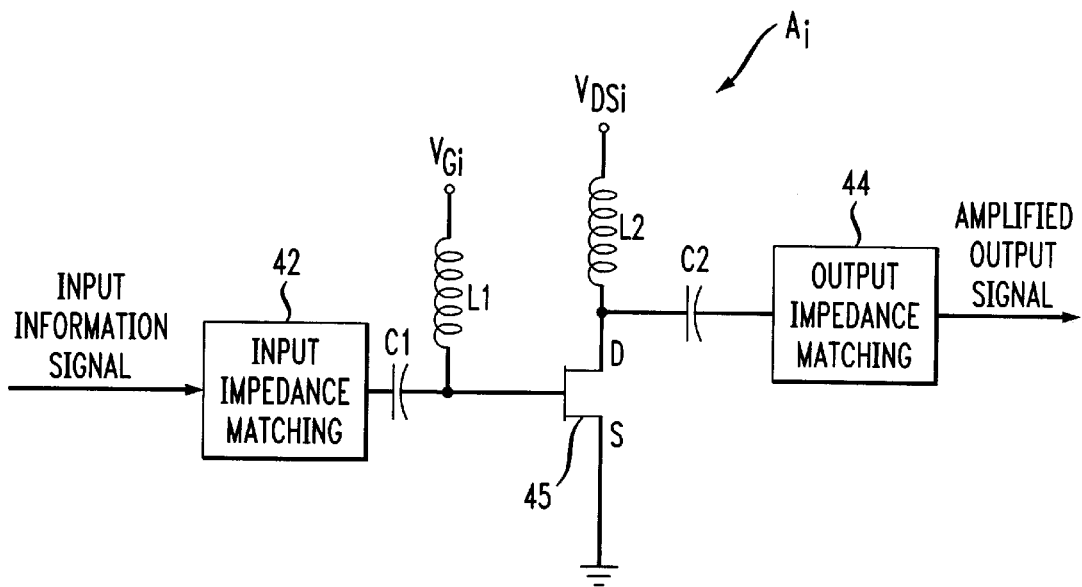
FIG. 7 is a circuit diagram of an amplification stage of a power amplifier.

FIG. 7 shows an exemplary circuit configuration for any amplifier stage $A_i$. A single, common-source FET 45 is utilized to amplify the information signal. Bias voltage $V_{Gi}$ is brought in to the gate (control terminal) of FET 45 via RF choke L1; bias voltage $V_{DSi}$ is brought in through choke L2. DC blocking capacitors C1 and C2 prevent DC voltage from reaching the adjacent stages. Input and output impedance matching structures 42, 44 provide the appropriate impedances to achieve the desired gain, output power, VSWR, stability, etc.

Figure 8:
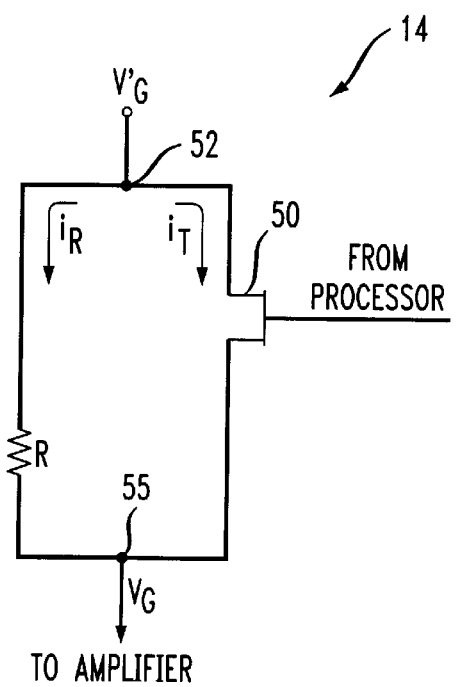
FIG. 8 is a circuit diagram of an exemplary variable gate bias supply circuit.

Referring to FIG. 8, an illustrative circuit diagram for gate voltage bias circuit 14 is shown. FET 50 operates under the control of processor 16 to switch the voltage $V_G'$ at circuit node 52 to circuit node 55 during normal transmit operation. That is, FET 50 is turned ON during the normal transmit periods, whereby current $i_T$ flows to node 55, so that $V_G$ at node 55 equals $V_{G,T}$, which is nearly equal to $V_G'$. During either the receive mode intervals and/or the weak signal mode, FET 50 is turned OFF so that current $i_R$ flows through resistor R and pulls down the voltage $V_G$ at node 55 to a suitable value for $V_{G,R}$ (or $V_{G,W}$). This will set the drain idle currents to the appropriate values for the receive intervals and/or the weak signal mode transmit intervals. If different gate voltages are to be supplied to the respective transistors of amplifier 12, additional resistors and FETS can be added in parallel, with the switching state of each FET being controlled by processor 16. In any event, other circuit arrangements to produce variable gate voltages under processor control will also be apparent to those skilled in the art.

Figure 9:
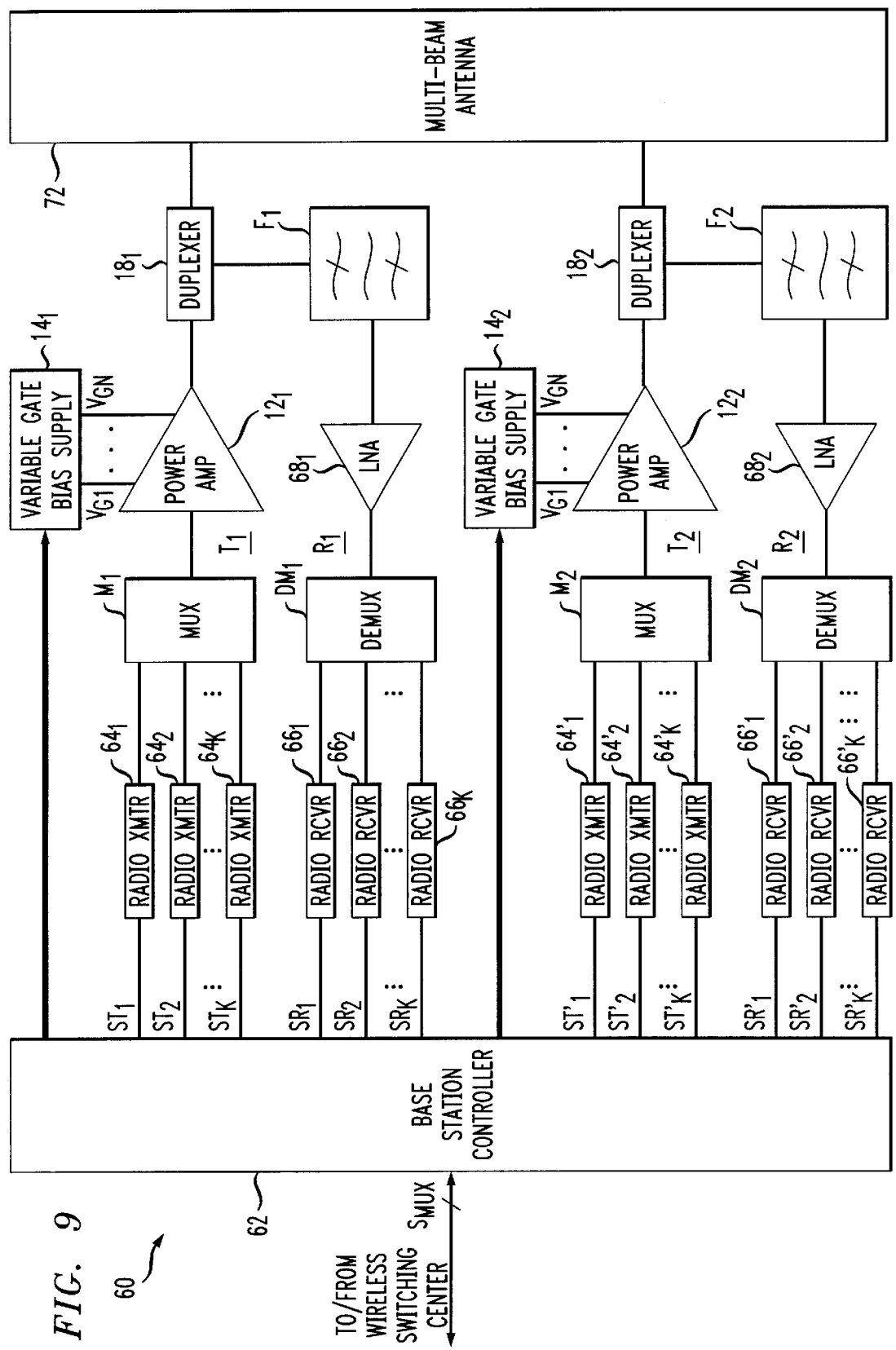
FIG. 9 is a block diagram of base station electronics in accordance with the invention.

Turning now to FIG. 9, a simplified block diagram of an illustrative base station 60 in accordance with the invention is shown. The base station includes a base station controller 62 coupled to a number of transmitter sections as $T_1$, $T_2$ and associated receiver sections as $R_1$, $R_2$. Base station controller 62 transmits and receives time division multiplexed information signals $S_{MUX}$ to and from a wireless switching center (not shown) connected to a wireline telephone network. Each transmitter section $T_i$ (e.g., $T_1$ or $T_2$) includes a power amplifier $12_i$ and variable gate bias supply circuit $14_i$ which operate in essentially the same manner as described above in connection with FIG. 1, except with base station controller 62 performing the functions of processor 12. Thus, idle drain currents are reduced during receive intervals of half-duplex operation and/or during weak signal mode transmit intervals. If the operation is full-duplex, idle currents are reduced during the weak signal mode operation as described above.

In the outbound direction, base station controller 62 demultiplexes and otherwise processes the input information signals $S_{MUX}$ from the switching center and converts the same to baseband signals as $ST_1$ to $ST_K$, each destined for a particular wireless terminal (or to a number of different wireless terminals if TDMA or CDMA protocols are used). If a half-duplex wireless communications protocol is used, base station controller 62 processes the outbound signals so that each signal as $ST_1$ to $ST_K$ contains signal energy only during the alternating transmit intervals. The outbound signals are modulated, filtered, and otherwise processed within respective radio transmitters as $64_1$ to $64_K$. If the system is based on an FDM protocol, each radio transmitter $64_i$ typically generates a unique carrier frequency that is modulated by the information signal. If CDMA is employed, a common carrier is modulated by many information signals within each radio transmitter $64_i$. In either case, the radio transmitter output signals are combined by multiplexer $M_1$ to form a multi-carrier, composite information signal which is applied as the input signal to the associated amplifier $12_i$. The information signal is amplified in accordance with the variable gate voltages $V_{G1}$ to $V_{GN}$ applied to the respective transistors therein (where N can be as low as one if all transistors are biased the same). The amplified output is routed through duplexer $18_i$ to multi-beam antenna 72.

The gate voltage commands supplied by base station controller to the various transmitter sections can be independent. For instance, at a given time, transmitter section $T_1$ may be operating in the weak signal condition whereas transmitter section $T_2$ is not. In this case, gate bias supply $14_1$ receives commands to modify the gate voltages during transmit to lower idle current whereas gate bias circuit $14_2$ is instructed to supply the strong signal condition gate voltages.

In the inbound direction, inbound information signals from wireless terminals are received by multi-beam antenna 72 and routed through each duplexer $18_i$. If the system operates in a half-duplex mode, then preferably the outbound frequencies are the same as the associated inbound frequencies to thereby maximize spectrum efficiency. The received signal through each duplexer $18_i$ is filtered by associated bandpass filter $F_i$ and then amplified by low noise amplifier $68_i$. The received signal is demultiplexed by demultiplexer $DM_i$, then demodulated and otherwise processed by radio receivers $66_1$ to $66_K$ (or $66_1'$ to $66_K'$ for receiver section $R_2$). The demodulated inbound signals as $SR_1$ to $SR_K$ are then time division multiplexed by base station controller 62 and transmitted to the wireless switching center.

While the present invention has been described above with reference to specific embodiments thereof, it is understood that one skilled in the art may make many modifications to the disclosed embodiments without departing from the spirit and scope of the invention. For instance, while the embodiments employ FETS in the power amplifiers, the amplifiers may alternatively utilize bipolar devices. In this case, a suitable variable base voltage supply circuit would be used in place of the gate voltage supply circuit to appropriately vary the voltage to the base (control terminal), and hence, vary the collector current in accordance with processor control. Such voltage control would be used to dynamically switch the transmit operating modes from class A to class AB and so forth to improve amplifier efficiency during the receive mode and/or during weak signal conditions. Moreover, while the system has been described in conjunction with a processor to control the variable gate bias circuit(s), the control function can be implemented in an application specific integrated circuit (ASIC), software, or with arrangements of discrete components as understood by one skilled in the art. In addition, the invention may have other applications aside from wireless communications such as in satellite broadcasting systems. Accordingly, these and other modifications are intended to be included within the scope of the invention as defined by the appended claims.

What is claimed is:

1. A method for improving efficiency of a radio frequency (RF) power amplifier of a communication system operating in a half-duplex mode, comprising the steps of:
   determining whether the communication system is operating during transmit intervals of said half-duplex mode;
   biasing a control terminal of a transistor of said amplifier at a first bias voltage if the communication system is operating during transmit intervals of said half-duplex mode; and
   biasing said control terminal at a second bias voltage different from said first bias voltage during receive intervals of said half-duplex mode, said second bias voltage being sufficient to reduce idle currents in said amplifier during said receive intervals, wherein said control terminal is consecutively biased between said first and second bias voltages;
   wherein said biasing of said control terminal at said first bias voltage during at least one transmit interval of the transmit intervals is initiated during a receive interval of the receive intervals preceding the at least one transmit interval of the transmit intervals.

2. The method of claim 1 wherein said transistor comprises a field effect transistor (FET) and said control terminal comprises a gate of said FET.

3. The method of claim 1, further comprising selectively operating said power amplifier during said transmit intervals in strong and weak signal modes, said control terminal being biased at said first bias voltage during strong signal mode transmit intervals; and
   biasing said control terminal, during weak signal mode transmit intervals, at a weak signal mode bias voltage different from said first bias voltage so as to increase amplifier efficiency during said weak signal mode.

4. The method of claim 1 wherein said first bias voltage is sufficient to operate said amplifier in class A amplification mode and said second bias level is sufficient to operate said amplifier in class AB amplification mode.

5. The method of claim 1 wherein said first bias voltage is sufficient to operate said amplifier at a first class AB operating point and said second bias voltage is sufficient to operate said amplifier at a second class AB operating point which produces lower idle current within said amplifier.

6. The method of claim 1 wherein said first bias voltage is sufficient to operate said amplifier in one of class A and class AB amplification modes and said second bias voltage is sufficient to operate said amplifier in class B amplification mode.

7. The method of claim 6, further comprising switching, during each receive interval, the bias voltage applied to said control terminal from said second bias voltage to said first bias voltage a predetermined time prior to the onset of the succeeding transmit interval, said predetermined time being sufficient to avoid nonlinear amplification during the succeeding transmit interval.

8. A transmitter for amplifying a half-duplex type information signal containing RF energy during transmit intervals and being substantially devoid of RF energy during receive intervals that alternate with said transmit intervals, said transmitter comprising:
   a radio frequency (RF) power amplifier having at least one transistor for amplifying said information signal;
   a variable biasing circuit for consecutively biasing at least one control terminal of said at least one transistor between a first bias voltage during said transmit intervals and a second bias voltage during said receive intervals, said second bias voltage being sufficient to reduce idle currents of said amplifier during said receive intervals; and
   a processor for controlling the variable biasing circuit for controlling the biasing of the at least one control terminal of said at least one transistor during said transmit and receive intervals;
   wherein said variable biasing circuit initiates biasing of said at least one control signal of said at least one transistor at said first bias voltage during at least one transmit interval of said transmit intervals at a time within a receive interval of said receive intervals preceding said at least one transmit interval.

9. The transmitter of claim 8, further comprising a processor for supplying commands to said variable biasing circuit to control the bias voltage output thereby.

10. The transmitter of claim 8 wherein said power amplifier comprises multiple stages and said variable biasing circuit supplies a variable bias voltage to each of said stages.

11. The transmitter of claim 8 wherein said biasing circuit comprises a source of supply voltage of approximately said first bias voltage, and a resistor connected in parallel with a switching transistor between said source of supply voltage and an output terminal, said switching transistor being switched on to provide said first bias voltage at said output terminal and being switched off to drop said supply voltage to said second bias voltage at said output terminal via said resistor.

12. The transmitter of claim 8 wherein said information signal is a multi-carrier signal.

13. The transmitter of claim 8 wherein said information signal is a CDMA signal containing information destined for a plurality of wireless terminals.

14. A base station in a wireless telecommunications system, comprising:
   a base station controller for receiving outbound information signals from a wireless switching center and processing said signals in accordance with a wireless communications protocol;
   a plurality of radio transmitters operable to modulate said processed signals;
   a multiplexer for combining said modulated signals to provide a composite information signal;
   a radio frequency (RF) power amplifier having at least one transistor for amplifying said composite information signal; and
   a variable biasing circuit for selectively biasing, under the control of said base station controller, at least one control terminal of said at least one transistor, to thereby dynamically control the idle currents flowing within said power amplifier so as to lower idle currents, wherein said base station controller determines at least one operational mode of said power amplifier for controlling said variable biasing circuit accordingly for selectively biasing said at least one control terminal of said at least one transistor of the power amplifier consecutively between first and second bias voltages during first and second intervals, respectively;
   wherein said variable biasing circuit initiates biasing of said at least one control signal of said at least one transistor at said first bias voltage during a first interval of said first intervals at a time within a second interval of said second intervals preceding said at least one transmit interval.

15. The base station of claim 14 wherein:

said wireless communications protocol comprises half-duplex mode operation;

said composite information signal contains signal energy during transmit intervals of said half-duplex mode and is substantially devoid of signal energy during receive intervals of said half-duplex mode;

said at least one control terminal is biased at a first bias voltage during said transmit intervals and at a second bias voltage during said receive intervals, said second bias voltage being sufficient to reduce idle currents drawn by said amplifier during said receive intervals.

16. The base station of claim 15 wherein said power amplifier is selectively operated during said transmit intervals in strong and weak signal modes, said control terminal being biased at said first bias voltage during strong signal mode transmit intervals and at a weak signal mode bias voltage different from said first bias voltage during weak signal mode transmit intervals, so as to increase amplifier efficiency during said weak signal mode.

17. The base station of claim 14 wherein:

said wireless communications protocol comprises full-duplex mode operation:

said base station controller is operable to implement strong and weak signal modes of operation, said power amplifier outputting reduced RF power during said weak signal mode as compared to said strong signal mode, said base station controller commanding said at least one control terminal to be biased at a first bias voltage during said strong signal mode and at a second bias voltage during said weak signal mode, said second bias voltage being sufficient to reduce idle currents drawn by said power amplifier as compared to idle currents drawn during said strong signal mode.

18. The base station of claim 14 wherein said at least one transistor comprises a field effect transistor (FET) and said control terminal comprises a gate of said FET.

19. The base station of claim 14 wherein said power amplifier comprises multiple stages and said variable biasing circuit supplies variable bias voltages to each of said stages.

20. The base station of claim 14, including a plurality of said power amplifiers and a plurality of said variable biasing circuits, each for supplying at least one variable bias voltage to an associated power amplifier, and each biasing circuit independently controlled by said base station controller and said base station controller determining at least one operational mode of each power amplifier.

21. A method for improving efficiency of a radio frequency (RF) power amplifier of a wireless communication system operating in a half-duplex mode, comprising the steps of:

selectively operating said power amplifier during transmit intervals of said half-duplex mode in a strong signal mode and in a weak signal mode in which amplifier output power is reduced relative to said strong signal mode;

biasing a control terminal of a transistor of said amplifier at a first bias voltage during strong signal mode operation;

biasing said control terminal, during said weak signal mode, at a weak signal mode bias voltage different from said first bias voltage so as to increase amplifier efficiency during said weak signal mode, wherein said control terminal is consecutively biased between one of said first bias voltage and said weak signal mode bias voltage during said transmit intervals and a receive signal mode bias voltage during receive intervals of said half-duplex mode; and wherein said biasing of said control terminal at said first bias voltage during at least one transmit interval of the transmit intervals is initiated during a receive interval of the receive intervals preceding the at least one transmit interval of the transmit intervals.

* * * * *